US006216364B1

(12) United States Patent
Tanaka et al.

(10) Patent No.: US 6,216,364 B1
(45) Date of Patent: Apr. 17, 2001

(54) METHOD AND APPARATUS FOR DRYING WASHED OBJECTS

(75) Inventors: Akinori Tanaka; Shoichi Okano; Isao Maki, all of Tokyo (JP)

(73) Assignee: Kaijo Corporation (JP)

( * ) Notice: Subject to any disclaimer, the term of this patent is extended or adjusted under 35 U.S.C. 154(b) by 0 days.

(21) Appl. No.: 09/291,860

(22) Filed: Apr. 14, 1999

(30) Foreign Application Priority Data

Apr. 14, 1998 (JP) .................................................. 10-102529
Apr. 7, 1999 (JP) .................................................. 11-100268

(51) Int. Cl.⁷ ....................................................... F26B 3/00
(52) U.S. Cl. ................... 34/448; 34/471; 34/476; 34/510; 34/517; 34/69; 34/72; 34/256; 34/258
(58) Field of Search ............................. 34/433, 443, 444, 34/448, 471, 467, 476, 493, 510, 516, 517, 60, 61, 69, 72, 92, 246, 255, 256, 258

(56) References Cited

U.S. PATENT DOCUMENTS

| 4,781,764 | 11/1988 | Leenaars . |
| 4,911,761 | 3/1990 | McConnell et al. . |
| 4,984,597 | 1/1991 | McConnell et al. . |
| 5,520,744 | * 5/1996 | Fujukawa et al. .................... 134/11 |
| 5,571,337 | 11/1996 | Mohindra et al. . |
| 5,634,978 | 6/1997 | Mohindra et al. . |
| 5,653,045 | 8/1997 | Ferrell . |
| 5,685,086 | 11/1997 | Ferrell . |
| 5,749,159 | * 5/1998 | Schwenkler ............................. 34/426 |
| 5,752,532 | * 5/1998 | Schwenkler ........................ 134/102.3 |

FOREIGN PATENT DOCUMENTS 0 385 536 B1    9/1990   (EP) .

OTHER PUBLICATIONS

The Japan Machinery Federation et al., "Report on Research and Study of High–Technology Transfer in Environmental Process Industry," 1993, pp. 47–49, published Mar. 1994 (in Japanese).
Corona Publishing Co., Ltd. Ultrasonic Engineering, "Ultrasonic Engineering," pp. 265–268, published Jan. 30, 1993 (in Japanese).

* cited by examiner

Primary Examiner—Pamela Wilson
(74) Attorney, Agent, or Firm—Lerner, David, Littenberg, Krumholz & Mentlik, LLP

(57) ABSTRACT

A drying apparatus for washed objects is capable of drying the objects in a reduced period of time, effectively preventing contamination of the objects during drying thereof, and attaining energy saving and a reduction in consumption of chemicals used. Mist of an organic solvent is generated by means of an ultrasonic wave in an organic solvent mist generating tank and the objects are immersed in a pure water tank, the pure water tank and organic solvent mist generating tank are then operated to communicate with each other to discharge pure water and place the objects in an atmosphere of the organic solvent mist, and then nitrogen gas is fed to the pure water tank to purge the organic solvent mist with the nitrogen gas.

20 Claims, 9 Drawing Sheets

METHOD AND APPARATUS FOR DRYING WASHED OBJECTS

BACKGROUND OF THE INVENTION

This invention relates to a method and an apparatus for drying washed objects, and more particularly to a method and an apparatus for rinsing and drying objects such as semiconductor wafers, glass substrates or the like which have been washed.

Drying of a precision substrate such as a finely-formed or fined wafer, glass substrate or the like following washing thereof is importantly affected by a degree at which a moisture entering trenches thereof is removed therefrom. In view of such a situation, a drying apparatus in which vapor of an organic solvent is used has been conventionally put to practice for this purpose. The drying apparatus using organic solvent vapor is constructed in such a manner as shown in FIG. 10 by way of example. More specifically, the drying apparatus includes a drying tank 40 and a heater 41 mounted on an outer surface of a bottom of the drying tank 40. The drying tank 40 is charged therein with an organic solvent 42, which is heated to a boiling point thereof by means of the heater 41, so that vapor of the organic solvent 42 may be formed in an upper region or portion of the tank 40. Then, objects 43 such as wafers or the like which have been subjected to washing and rinsing using water or the like are placed in the vapor. This results in the organic solvent which is evaporated more readily than water being condensed on a surface of the object 43 while being substituted for water adhered to the surface of the object 43.

The objects 43 in the vapor are gradually increased in temperature to a vapor temperature or boiling point of the organic solvent 42 and then taken out of the vapor atmosphere, resulting in the solvent adhered to the objects 43 being rapidly evaporated due to reduced latent heat thereof, leading to completion of drying of the objects 43. The drying tank 40 has a cooling coil 44 arranged in the upper portion thereof, which functions to condense the organic solvent evaporated by heating. The organic solvent thus condensed is dropped onto a liquid receiver 45 and then recovered for reuse. Likewise, the organic solvent in the form of liquid containing water which is dropped from the objects 43 is recovered by another liquid receiver 46.

Unfortunately, in the conventional drying apparatus thus constructed, it is required that an operator is highly careful with fire because the organic solvent is heated. Also, it causes energy consumption to be substantially increased due to both heating and cooling of the organic solvent. Further, it requires much time for the drying because of heating the organic solvent to form a layer of the vapor and is increased in consumption of the organic solvent due to loss by evaporation. In addition, when the objects are brought into contact with the layer of the vapor, heat of the vapor (gaseous phase) is removed by the objects to cause a rapid phase change of the organic solvent from gas to liquid. This reduces the vapor layer, to thereby cause the objects to be exposed to an ambient atmosphere, leading to problems such as contamination of the objects, a failure in drying thereof and the like. Also, there is likelihood that the organic solvent is contaminated by dust contained in the ambient atmosphere, leading to contamination of the objects.

SUMMARY OF THE INVENTION

The present invention has been made in view of the foregoing disadvantages of the prior art.

Accordingly, it is an object of the present invention to provide a method and an apparatus for drying washed objects which are capable of satisfactorily drying the objects in a reduced period of time.

It is another object of the present invention to provide a method and an apparatus for drying washed objects which are capable of effectively preventing contamination of the objects during drying thereof.

It is a further object of the present invention to provide a method and an apparatus for drying washed objects which are capable of attaining energy saving and a reduction in consumption of chemicals used.

It is a still further object of the present invention to provide a method and an apparatus for drying washed objects which are capable of efficiently generating mist of an organic solvent acting as a drying agent at a low temperature.

In accordance with one aspect of the present invention, a drying method for washed objects is provided. The drying method comprises the steps of: rinsing the objects which are immersed in pure water in a pure water tank; generating mist of an organic solvent at a normal temperature in an organic solvent mist generating tank by exciting the organic solvent by means of an ultrasonic wave; supplying the organic solvent mist to the pure water tank from the organic solvent mist generating tank while discharging the pure water from the pure water tank at a predetermined rate to thereby place the objects in an atmosphere of the organic solvent mist; and feeding nitrogen gas to the pure water tank to purge the organic solvent mist with the nitrogen gas.

In a preferred embodiment of the present invention, the drying method further comprises the step of maintaining the temperature of the organic solvent at a normal temperature.

In a preferred embodiment of the present invention, the organic solvent is excited by an ultrasonic wave having a frequency in the Megahertz range and the organic solvent mist is adsorbed on surfaces of the objects.

In a preferred embodiment of the present invention, the organic solvent is excited by an ultrasonic wave having a frequency in the range of 0.5 MHz to 10 MHz, the temperature of the organic solvent mist is selected to be 20° C. to 50° C., and droplets of the organic solvent mist have a diameter not greater than 100 μm.

In a preferred embodiment of the present invention, the predetermined rate at which the pure water is discharged from the pure water tank is selected so that droplets of the pure water and organic solvent or a liquid film of the pure water and organic solvent having a thickness of 10 nm to 1 μm is formed on the surfaces of the objects without forming a mixed layer of the pure water and the organic solvent on a surface of the pure water.

In accordance with another aspect of the present invention, a drying apparatus for washed objects is provided. The drying apparatus includes a pure water tank constructed so as to permit pure water to be introduced thereinto and discharged therefrom, to thereby rinse the objects which are immersed in the pure water; an organic solvent mist generating tank arranged so as to selectively communicate at an upper portion thereof with the pure water tank and constructed so as to permit an organic solvent charged therein to be excited by means of an ultrasonic wave, to thereby generate mist of the organic solvent at a normal temperature in the organic solvent mist generating tank; an organic solvent mist supplying means for supplying the organic solvent mist to the pure water tank from the organic solvent mist generating tank; a pure water discharge means for discharging the pure water from the pure water tank at a predetermined rate while the pure water tank and organic solvent mist generating tank are operated to communicate with each other to thereby place the objects in an atmosphere of the organic solvent mist; and a nitrogen gas feeding means for feeding nitrogen gas to the pure water tank to purge the organic solvent mist with the nitrogen gas.

In a preferred embodiment of the present invention, the organic solvent mist generating tank has a double-tank structure including an inner tank member and an outer tank member, the outer tank member being mounted on an outer surface of a bottom thereof with a vibration plate having an ultrasonic transducer attached thereto, the inner tank member having a bottom formed with a thickness which permits ultrasonic energy to penetrate therethrough, the inner tank member and outer tank member being arranged so as to permit circulating water for temperature adjusting to flow within a space defined between the inner tank member and outer tank member, the inner tank member being charged therein with the organic solvent, which is circulated through a piping arranged in the circulating water.

In a preferred embodiment of the present invention, the pure water tank is so constructed that an upper portion thereof is selectively completely closed.

In a preferred embodiment of the present invention, the organic solvent is excited by an ultrasonic wave having a frequency in the Megahertz range and the organic solvent mist is adsorbed on surfaces of the objects.

In a preferred embodiment of the present invention, the organic solvent is excited by an ultrasonic wave having a frequency in the range of 0.5 MHz to 10 MHz, the temperature of the mist of the organic solvent is selected to be 20° C. to 50° C. and droplets of the mist of the organic solvent have a diameter not greater than 100 $\mu$m.

In a preferred embodiment of the present invention, the predetermined rate at which the pure water is discharged by the pure water discharge means is selected so that without forming a mixed layer of the pure water and the organic solvent on a surface of the pure water, droplets of the pure water and organic solvent or a liquid film of the pure water and organic solvent having a thickness of 10 nm to 1 $\mu$m is formed on the surfaces of the objects.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENT

Now, a method and an apparatus for drying washed objects according to the present invention will be described hereinafter with reference to FIGS. 1 to 9.

Figure 1:
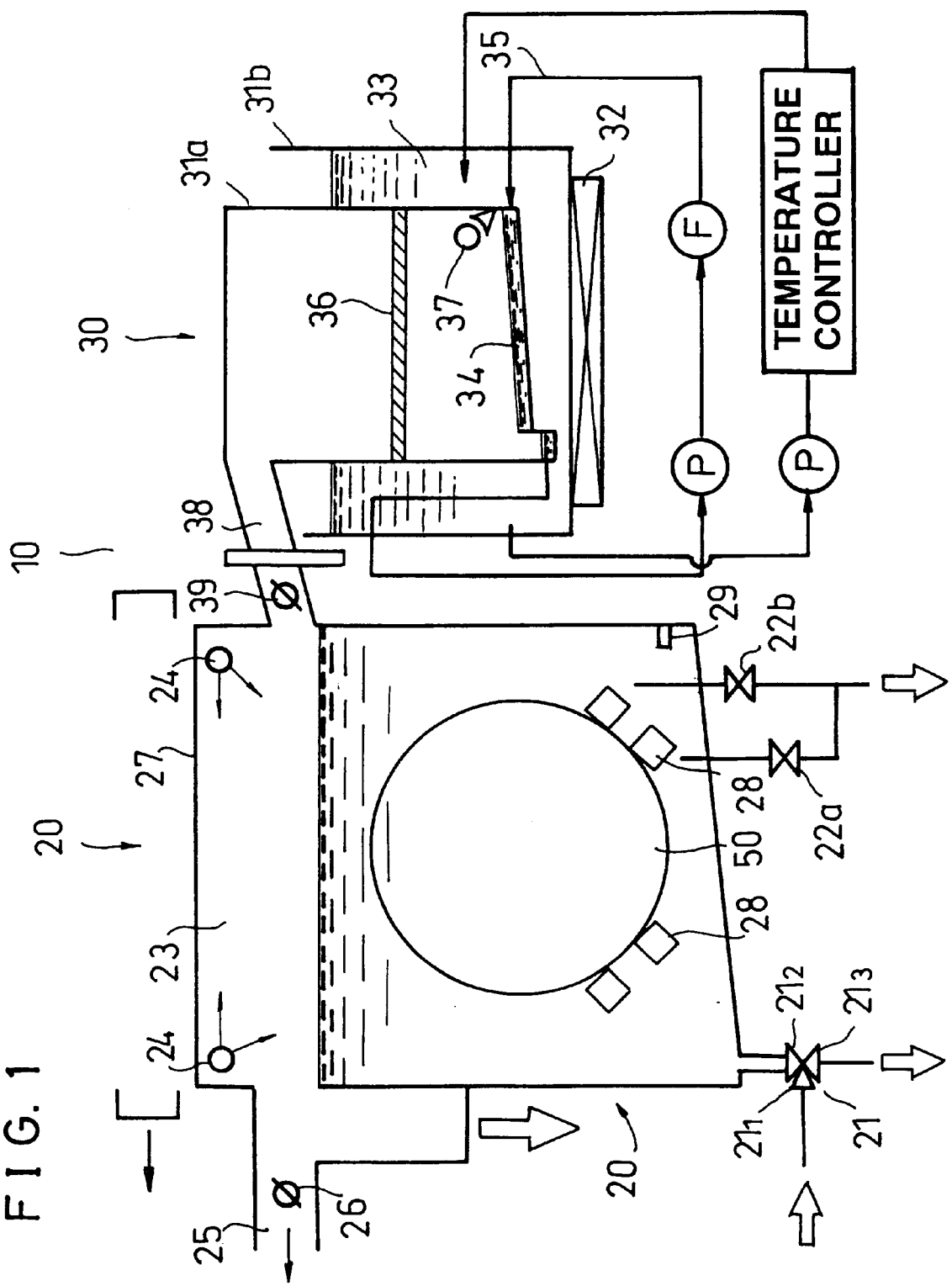
FIG. 1 is a schematic view showing an embodiment of a drying apparatus for washed objects according to the present invention.

Referring first to FIG. 1, an embodiment of a drying apparatus for washed objects according to the present invention is illustrated. A drying apparatus of the illustrated embodiment which is generally designated at reference numeral 10 generally includes a pure water tank 20 and an organic solvent mist generating tank 30 for generating mist of an organic solvent. The mist generating tank 30 has a double-tank structure including an inner tank member 31a and an outer tank member 31b. The outer tank member 31b is provided on an outer surface of a bottom thereof with a vibration plate 32 having an ultrasonic transducer attached thereto. The bottom of the inner tank member 31a is formed with a thickness which permits ultrasonic energy to penetrate therethrough. Also, the mist generating tank 30 is constructed so as to permit circulating water 33 for temperature adjusting to flow within a space defined between the inner tank member 31a and the outer tank member 31b.

The inner tank member 31a is charged therein with an organic solvent 34, which is circulatedly guided through a piping 35 of which a part is arranged in the circulating water 33, to thereby be cooled or heated, resulting in the temperature of the organic solvent 34 being adjusted at a predetermined temperature, for example, at 20° C. to 50° C. In the illustrated embodiment, isopropyl alcohol (IPA) is used as the organic solvent 34. Also, the inner tank member 31a is provided therein with a splash guard plate 36 in a manner to be positioned at a center of the inner tank member 31a. Further, the inner tank member 31a is provided therein with a nitrogen gas feed port 37 in a manner to be positioned at a location somewhat below the center thereof. In addition, the inner tank member 31a is constructed so as to communicate at an upper portion thereof with an upper portion of the pure water tank 20 through a communication passage 38. The communication passage 38 is provided therein with a valve 39 which is constructed so as to be open to permit a flow in only a direction from the inner tank member 31a toward the pure water tank 20.

The pure water tank 20 is provided on a lower portion thereof with a pure water feed and discharge valve 21 and first and second discharge valves 22a and 22b for discharging pure water at a first predetermined flow rate. In the illustrated embodiment, the pure water feed and discharge valve 21 comprises a three-way valve including valve ports $21_1$, $21_2$ and $21_3$. Alternatively, it may comprise a four-way valve. Thus, the pure water tank 20 is fed therein with pure water through the valve ports $21_1$, and $21_2$ of the pure water feed and discharge valve 21, so that when pure water reaches a predetermined level in the pure water tank 20, excessive pure water is permitted to run over the tank. This results in a gaseous or vapor phase space 23 being defined in an upper portion of the pure water tank 20. The vapor phase space 23 is provided therein with nitrogen gas feed ports 24 and has an exhaust pipe 25 connected thereto through which the vapor phase space 23 is permitted to communicate with an ambient atmosphere. The exhaust pipe 25 is provided therein with a valve 26, which is arranged so as to be open to permit a flow in only a direction from the pure water tank 20 toward an ambient atmosphere. Also, the pure water tank 20 is provided on the upper portion thereof with an openable cover 27 of the completely-closed type through which washed objects 50 are accessed to and removed from an interior of the pure water tank 20. Further, the pure water tank 20 is provided therein with supports 28 adapted to support the objects 50 thereon, as shown in FIG. 1.

The pure water tank 20 is provided in the lower portion thereof with a liquid level sensor 29 in a manner to be positioned at substantially the same height or level as an open end of a first pipe extending into the pure water tank 20 from the first discharge valve 22a and at substantially the same level as or slightly below lower ends of the objects or wafers 50. A second pipe arranged so as to extend into the pure water tank 20 from the second discharge valve 22b has an open end positioned at a level by 1 to 2 mm higher than the open end of the first pipe.

Now, the manner of operation of the drying apparatus 10 of the illustrated embodiment thus constructed will be described hereinafter.

Figure 2:
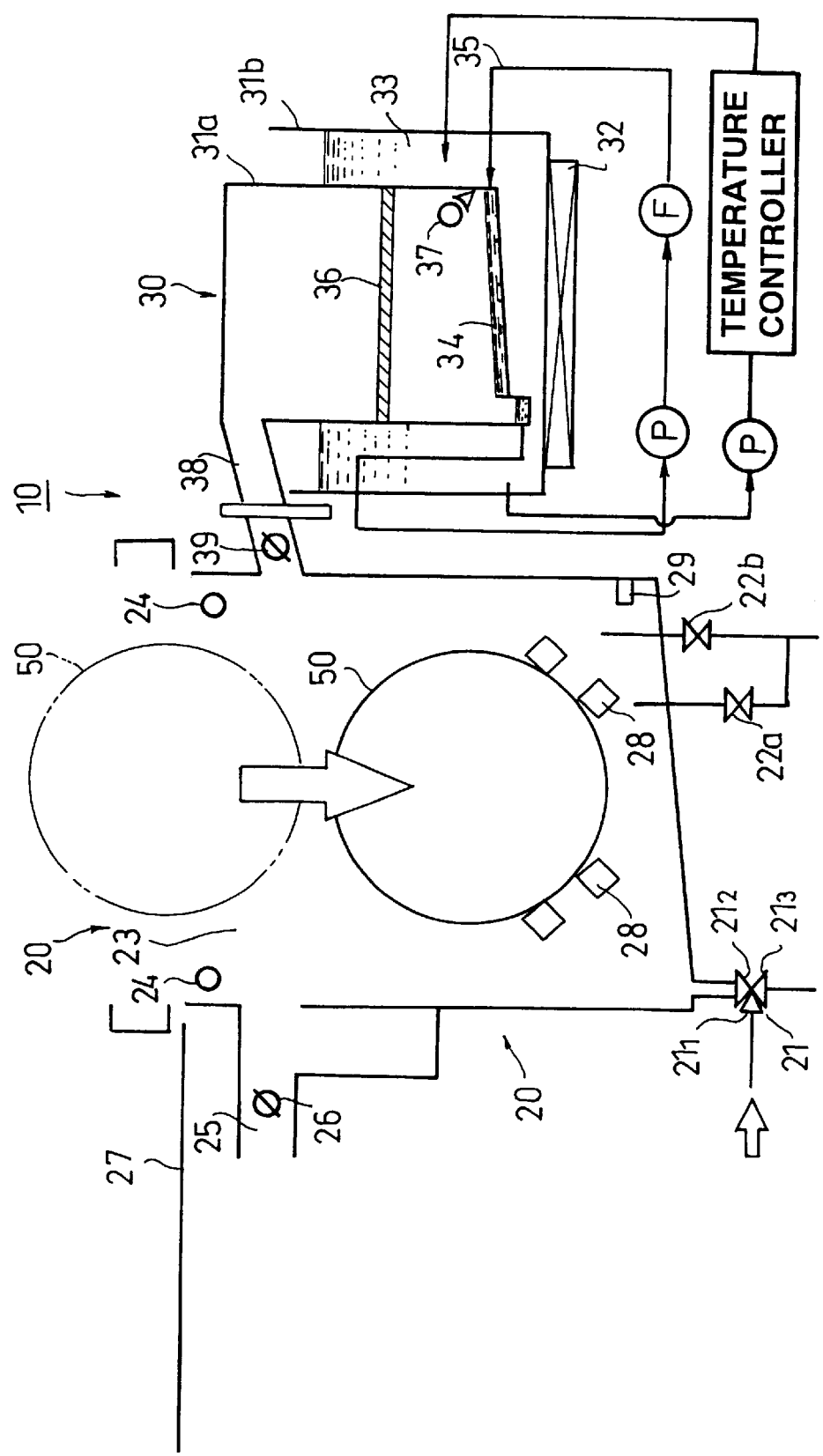
FIG. 2 is a schematic view showing the step of placing washed objects in a pure water tank of the drying apparatus.

First, the cover 27 of the pure water tank 27 is rendered open, so that objects or wafers 50 which have been washed and/or subjected to preliminary rinsing are supported on the supports 28, as shown in FIG. 2. The supports 28 may be placed in the pure water tank 20 while having the objects 50 previously supported thereon.

Then, a predetermined amount of the organic solvent (IPA) 34 is charged in the inner tank member 31a of the organic solvent mist generating tank 30 so as to have a depth of 5 mm or less and a high frequency voltage of a frequency as high as 0.5 MHz or more, and more specifically 0.5 MHz to 10 MHz, and of 0.5 W/cm$^2$ or more in power is applied to the ultrasonic transducer of the vibration plate 32 mounted on the outer tank member 31b, leading to oscillation of the transducer. This results in organic solvent mist at a normal temperature of 20° C. to 50° C. being generated in the inner tank member 31a by occurring of a capillary wave. Droplets of the organic solvent mist have a diameter not greater than 100 $\mu$m.

Figure 7:
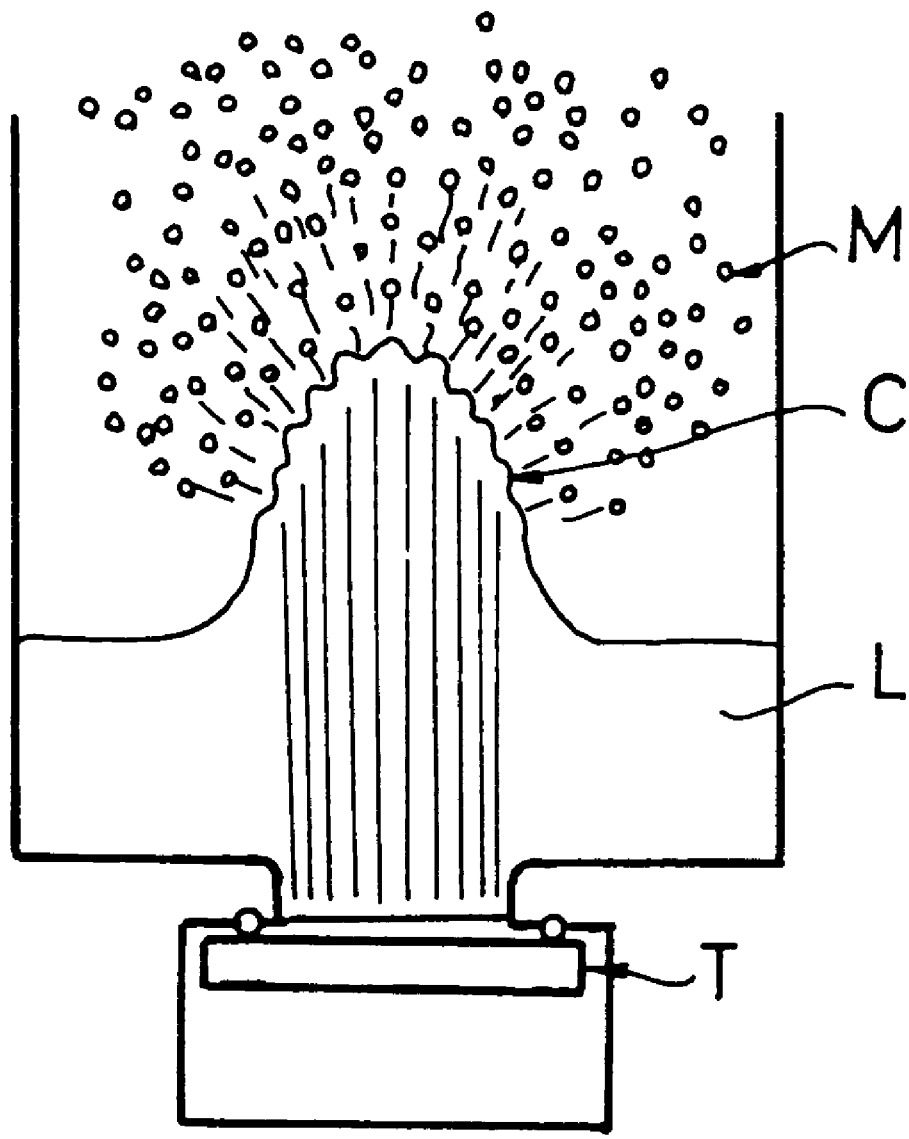
FIG. 7 is a schematic view illustrating the principle of generation of the organic solvent mist.

The generation of the organic solvent mist by a capillary wave C will be described with reference to FIG. 7. When ultrasonic vibration in a liquid L by an ultrasonic transducer T is rendered strong, a radiation pressure of sound increases, and if a vibration frequency is high, a sound pressure concentrates with directivity. This causes the liquid L to be partly raised to form a liquid column. Concurrently, a surface wave occurs on a surface of the liquid, whereas an interference wave occurs on a surface of the liquid column with a periphery of the liquid column acting as a boundary of reflection. When energies of collision and tearing of the liquid on the surface of the liquid column exceed a surface tension of the liquid L, the liquid is converted into fine particles M which fly about in the air.

The circulating water 33 for temperature adjusting is circulated within the space between the inner tank member 31a and the outer tank member 31b, to thereby cool or heat the organic solvent 34 through the bottom of the inner tank member 31a. The organic solvent 34 is also cooled or heated by circulating it through a portion of the piping 35 which is immersed in the circulating water 33. Such construction effectively keeps the temperature of the organic solvent 34 in the inner tank member 31a at a temperature of 20° C. to 50° C. in spite of operation of the drying apparatus 10 over a prolonged period of time and positively prevents operation of the ultrasonic transducer in a state where no liquid exists even when the inner tank member 31a is emptied of the organic solvent 34.

Figure 3:
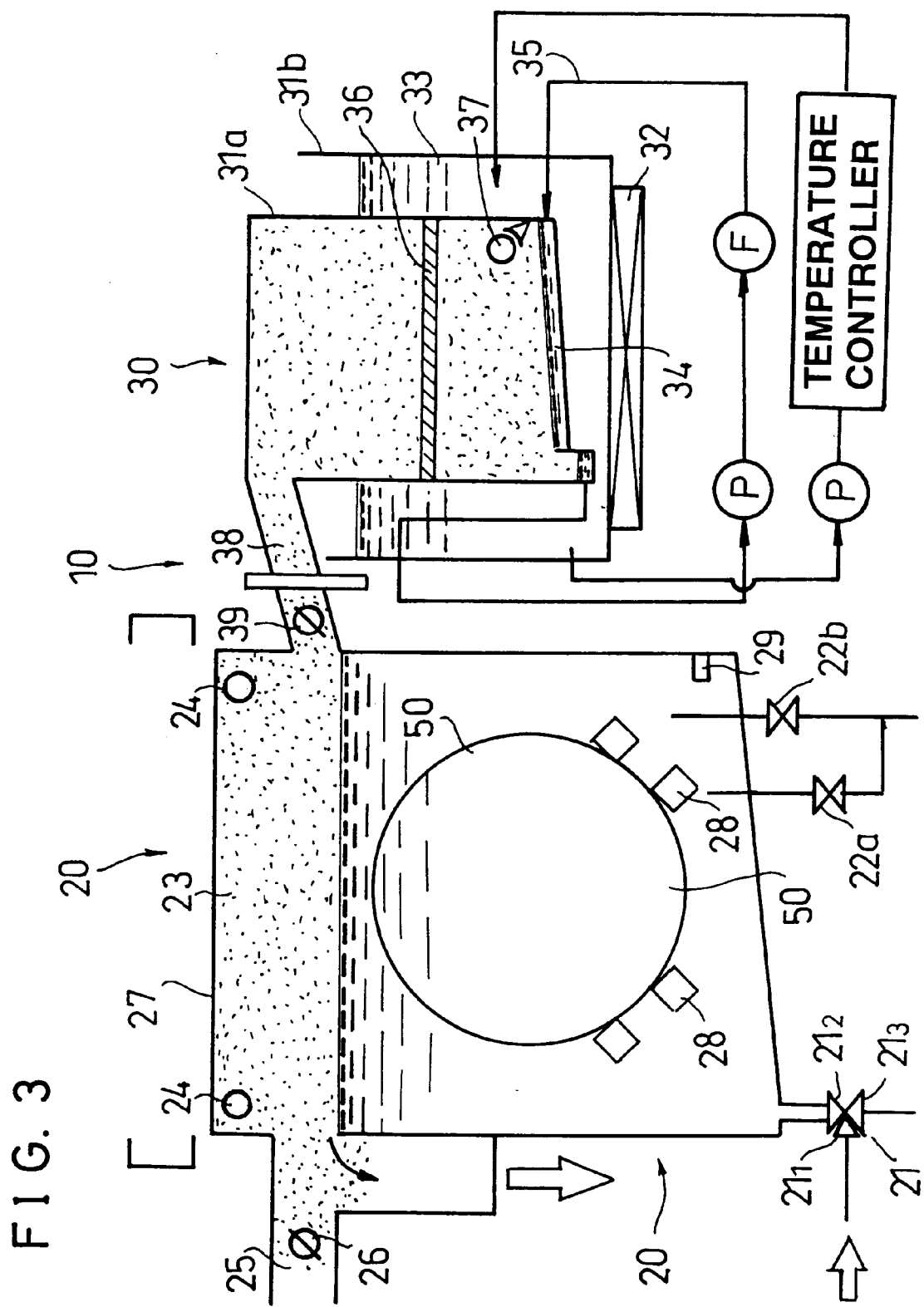
FIG. 3 is a schematic view showing the step of feeding pure water and an organic solvent mist to the pure water tank.
Figure 4:
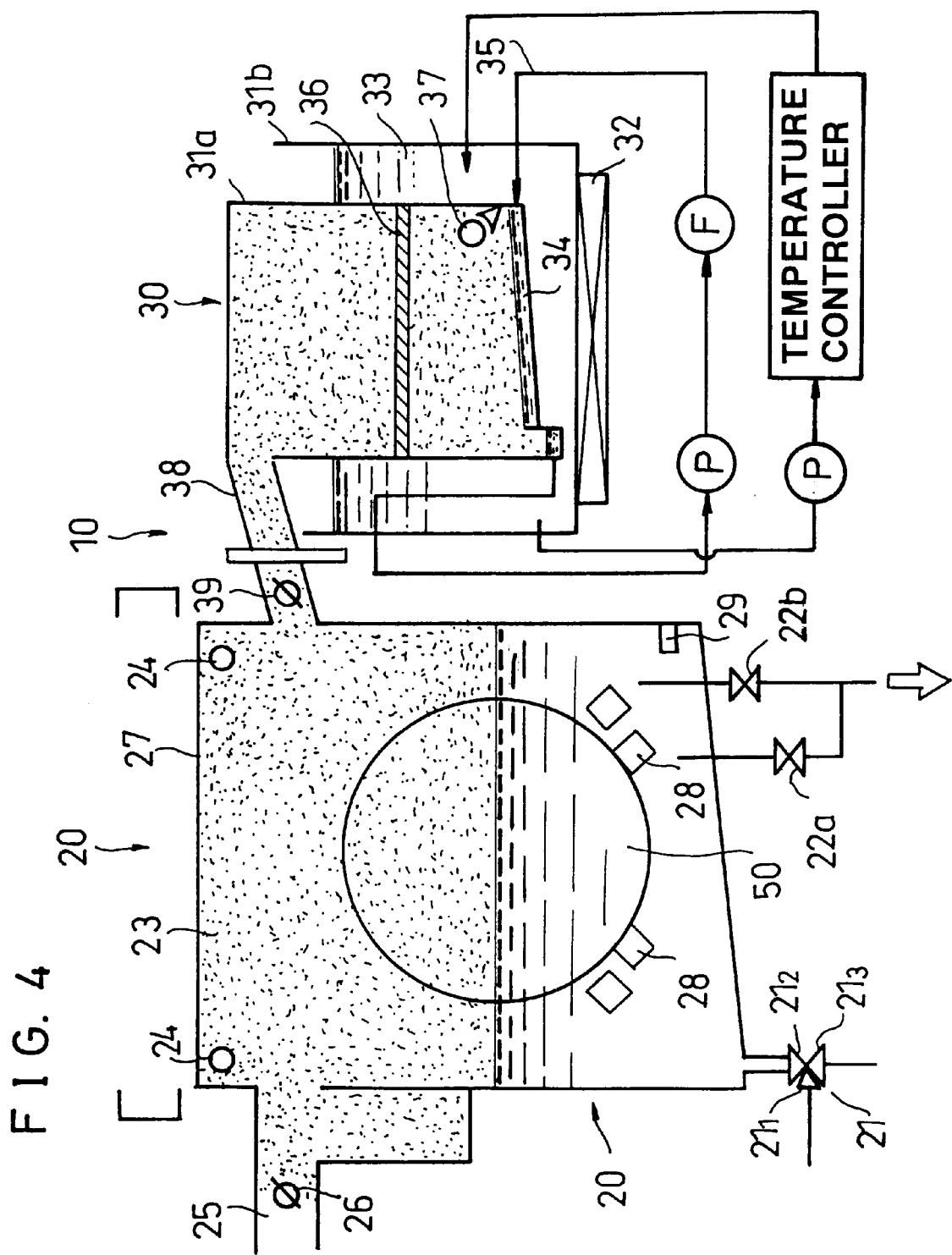
FIG. 4 is a schematic view showing the step of discharging the pure water from the pure water tank and place the objects in an atmosphere of the organic solvent mist.

Subsequently, the cover 27 is closed and the pure water tank 20 is fed with pure water to immerse the objects 50 in the pure water, resulting in the objects 50 being subjected to final rinsing. Then, the pure water in the pure water tank 20 is discharged through the first and second discharge valves 22a and 22b at the first flow rate. A pressure in the pure water tank 20 is gradually reduced with progress of discharge of the pure water through the valves 22a and 22b, to thereby cause the valve 39 in the communication passage 38 arranged between the pure water tank 20 and the organic solvent mist generating tank 30 to automatically open, so that organic solvent mist at an increased concentration may enter the pure water tank 20 from the organic solvent mist generating tank 30, as shown in FIGS. 3 and 4. The first flow rate of the discharge of the pure water through the first and second valves 22a and 22b is selected so that a mixture layer of the pure water and organic solvent is not formed on a surface of the pure water and that droplets of the pure water and organic solvent or a liquid film of the pure water and organic solvent having a thickness of 10 nm to 1 $\mu$m are/is formed on the surfaces of the objects 50. Such entering of the organic solvent mist permits water films on the objects 50 to be replaced with the organic solvent mist. The water films thus replaced are condensed and dropped while being mixed with the organic solvent.

When a level of the pure water in the pure water tank 20 is lowered below the open end of the pipe connected to the second discharge valve 22b, discharge of the pure water through the second discharge valve 22b is interrupted, resulting in discharge of the pure water being carried out through only the first discharge valve 22a, leading to a reduction in the rate at which the pure water is discharged. In the illustrated embodiment, discharge of the pure water through both first and second discharge valves 22a and 22b results in a velocity at which the water level is lowered being about 2 to 4 mm/sec; whereas when the discharge is carried out through only the second discharge valve 22a, the velocity is as low as about 1 mm/sec.

When the liquid level is further lowered to a degree sufficient to permit the liquid level sensor 29 to detect the liquid level, the valve ports 21$_2$ and 21$_3$ of the valve 21 are open to ensure the discharge at an increased rate.

Such control of the discharge rate of the pure water provides sure drying of the objects or wafers 50. Since the water in contact with the wafers 50 is apt to remain on the lower edge portions of the wafers 50, the discharge rate of the pure water is reduced when the liquid level is lowered to the lower portions of the wafers 50. When the wafers 50 have completely emerged out of the pure water, it is not required to discharge the pure water at the low rate, but instead the pure water is discharged at the increased rate through the three-way valve 21 which is rendered open.

Figure 5:
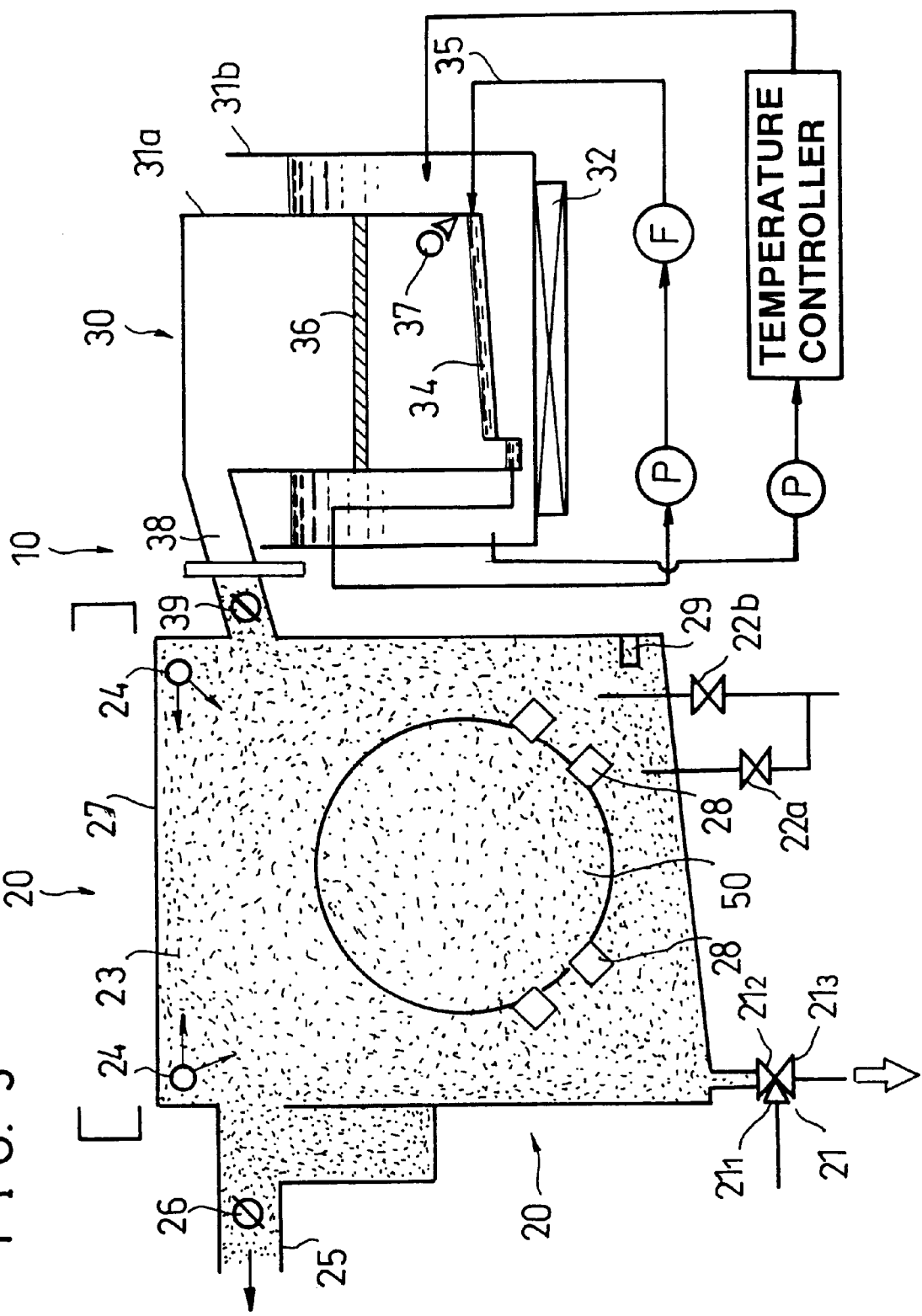
FIG. 5 is a schematic view showing the step of feeding nitrogen gas to the pure water tank to purge the organic solvent mist and complete drying the surfaces of the objects.
Figure 6:
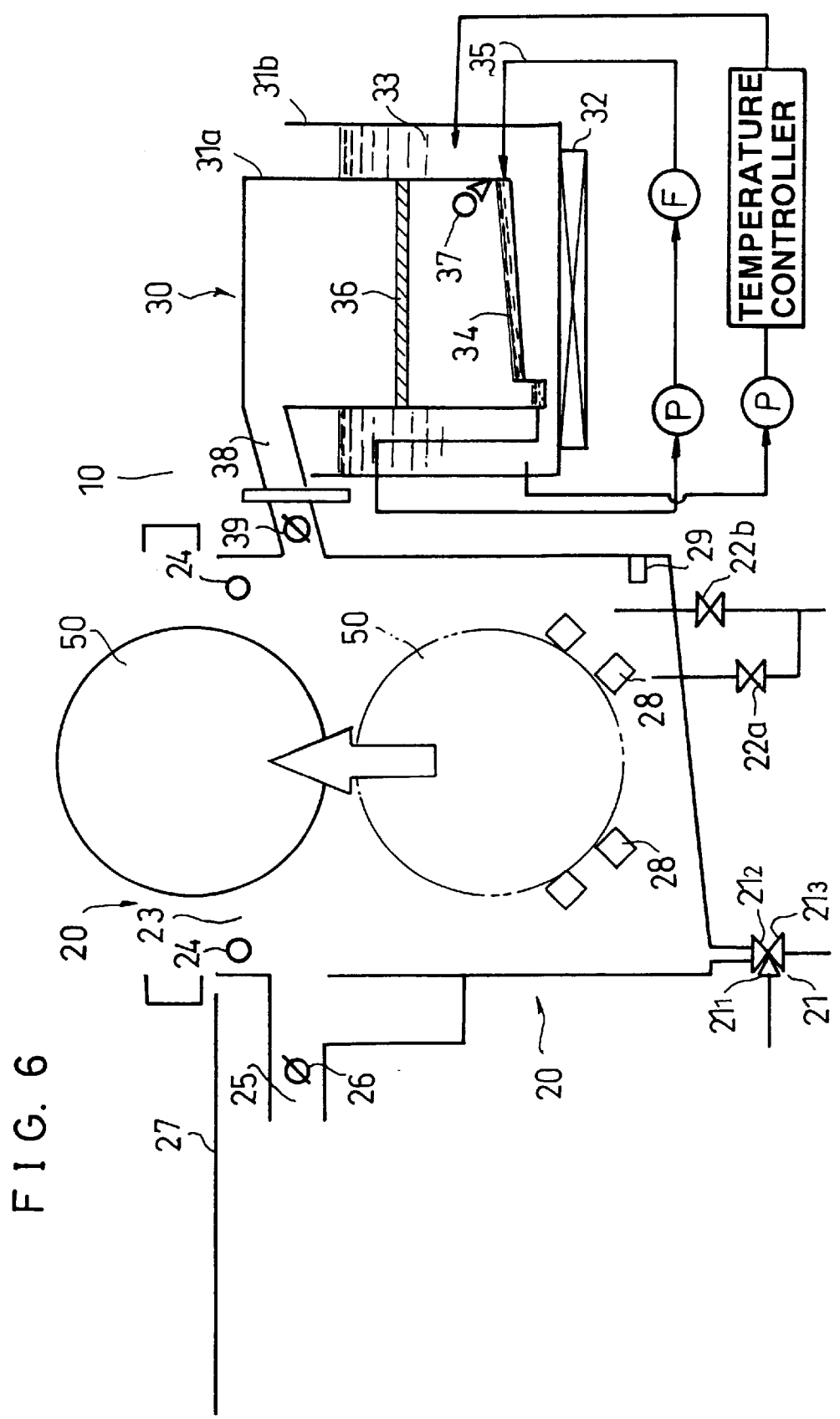
FIG. 6 is a schematic view showing removal of the objects from the pure water tank.

After a predetermined period of time elapses, nitrogen gas which is heated to a temperature of about 50° C. is fed through the nitrogen gas feed ports 24 into the pure water tank 20, as shown in FIG. 5, to purge the organic solvent mist in the pure water tank 20 with the nitrogen gas, so that the organic solvent: mist is outwardly exhausted from the exhaust pipe 25 through the valve 26, resulting in the objects 50 being placed in an atmosphere of the heated nitrogen gas. This permits any moisture or water and organic solvent on the objects 50 in the nitrogen gas atmosphere to be removed therefrom, followed by opening of the cover 27 for removal of the objects 50 from the pure water tank 20, as shown in FIG. 6.

Figure 8:
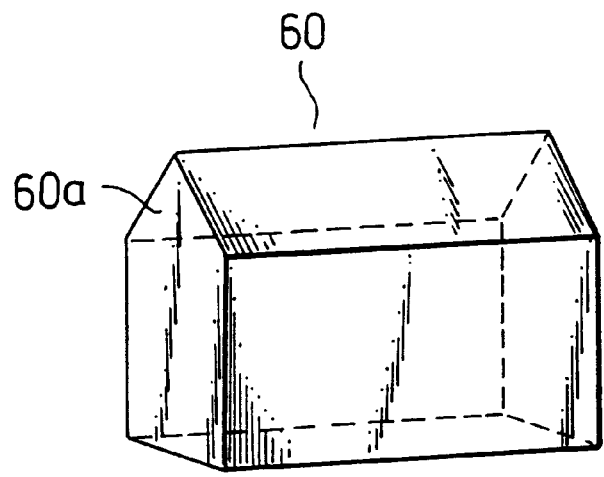
FIG. 8 is a perspective view showing an edged knife.
Figure 9:
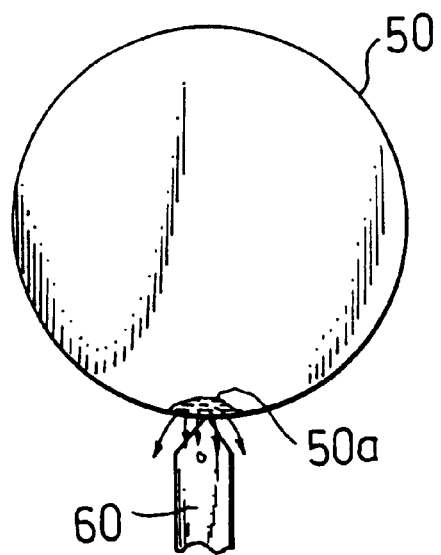
FIG. 9 is a schematic view showing contact of the edged knife with a droplet on an edge portion of the object.
Figure 10:
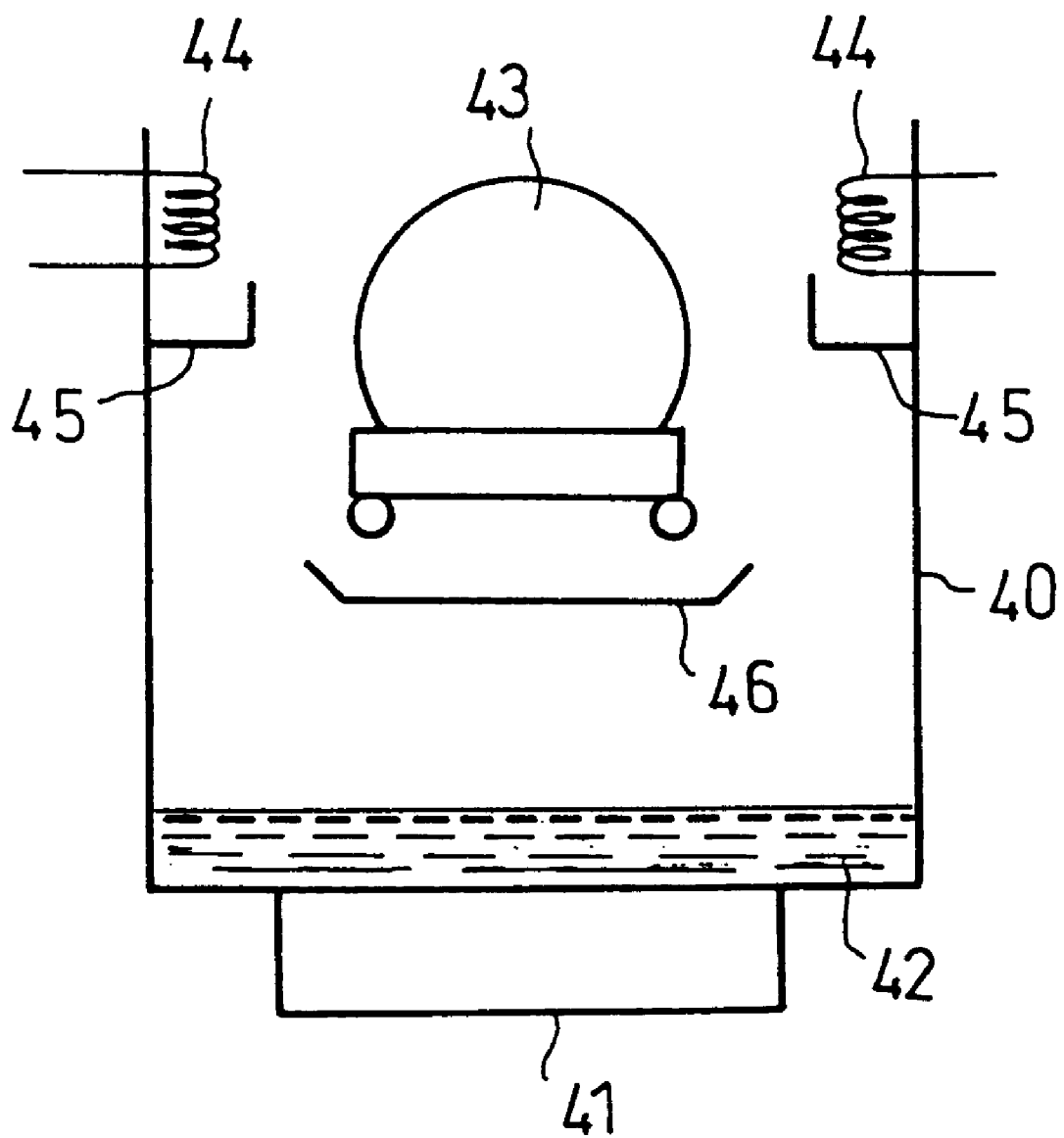
FIG. 10 is a schematic view showing a conventional drying apparatus.

In practicing of the illustrated embodiment, droplets are apt to remain on supported portions of the objects 50. In order to avoid such a problem, an edged knife 60 which has a distal end 60a sharpened at an acute angle as shown in FIG. 8 may be used. The edged knife 60, as shown in FIG. 9, is so arranged that the distal end 60a is accessible to droplets 50a remaining on an edge portion of each object 50. In this instance, when the edged knife 60 is made of a hydrophilic material or a material of which a surface is made of a hydrophilic material, the droplets 50a remaining on the edge portions of the objects 50 are permitted to be positively downwardly guided through the edged knife 60, to thereby ensure rapid removal of the droplets therefrom.

As described above, the drying apparatus of the illustrated embodiment permits the objects 50 to be subjected to drying at a normal temperature using an organic solvent, to thereby eliminate both heating and cooling of the organic solvent and promote energy saving. Also, it facilitates the drying operation because it is not required that an operator is careful with fire. Further, the drying operation at a normal temperature in the illustrated embodiment does not cause heat of the organic solvent mist to be removed by the objects even when the objects are brought into contact with the mist, to thereby eliminate any phase change of the mist and exposure of the objects to an ambient atmosphere. In addition, the illustrated embodiment rapidly condenses the moisture or water in the organic solvent atmosphere at an increased concentration, to thereby exhibit excellent drying characteristics. Furthermore, in the illustrated embodiment, the organic solvent mist is replaced with the inert or nitrogen gas atmosphere, to thereby effectively exclude oxygen, resulting in formation of any water mark being prevented. Also, the illustrated embodiment eliminates heating using a heater, to thereby permit the drying operation to be carried out in a short period of time, leading to an increase in productivity. Moreover, the drying operation takes place in a closed environment, to thereby prevent contamination of the objects.

According to one embodiment of the present invention, the organic solvent 34 is excited by an ultrasonic wave having a frequency in the Megahertz range to generate a large amount of the organic solvent mist and the organic solvent mist is adsorbed on the surfaces of the objects 50 by discharging the pure water at a relatively high flow rate, to thereby prevent a mixture layer of the pure water and organic solvent from being formed on the surface of the pure water. The droplets of the pure water and organic solvent or the liquid film of the pure water and organic solvent having a thickness of 10 nm to 1 $\mu$m which are/is formed on the surfaces of the objects 50 can be dried by the heated nitrogen gas.

Furthermore, according to the embodiment of the present invention, the organic solvent 34 is excited by an ultrasonic wave having a frequency in the Megahertz range, to thereby efficiently generate a sufficient amount of the organic solvent mist immediately at a normal temperature. In the conventional apparatus, the organic solvent, such as IPA, which is a flammable liquid, is heated to a boiling point (approximately 82° C.) and the consumption of IPA amounts to about 600 ml for a single drying operation, whereas the embodiment of the present invention can reduce the consumption of the organic solvent 34 to 200 ml or less, resulting in a cost being decreased. In addition, time required for the single drying operation is reduced to about 6 minutes as compared with the conventional apparatus which requires about 10 minutes, to thereby enhance throughput. Moreover, if an ultrasonic output is rendered variable, the amount of the generated organic solvent mist can be controlled. In the illustrated embodiment, the organic solvent, such as IPA, is used at a low temperature of 20° C. to 50° C. in the inert or nitrogen gas atmosphere, to thereby prevent fire.

In the illustrated embodiment, the number of contaminant particles having a diameter of 0.2 $\mu$m or more and adhered to the surfaces of wafers 50 was counted before and after being subjected to a drying operation in the drying apparatus 10, by selecting two, namely, the first wafer S1 and the twenty-fifth wafer S2, out of twenty-five (25) wafers. There is no great difference in the number of the particles between the wafers before the drying operation and those after the drying operation, as shown in Table.

TABLE

| Wafer No. | Number of particles (>0.2 $\mu$m in diameter) | |
|---|---|---|
| | Before Drying Operation | After Drying Operation |
| S1 | 150 | 143 |
| S25 | 150 | 170 |

It is noted that a relationship between a dryness or wetness of a surface of an object and a thickness of a liquid film formed on the surface of the object is illustrated in "Report on Research and Study of High-technology Transfer in Environmental Process Industry 1993" The Japan Machinery Federation et al., pp. 48–49, Mar. 1994. According to this publication, the liquid film having a thickness less than 10 nm indicates a dry state; the liquid film having a thickness of 10 nm to 1 $\mu$m a state where the liquid is adsorbed; and the liquid film having a thickness above 1 $\mu$m a wet state. In the embodiment of the present invention, as a liquid film which is formed on the surfaces of the wafers 50 has an average thickness of, for example, 0.802 $\mu$m when the wafers 50 are exposed to the organic solvent or IPA mist, and thus such a liquid film would be considered to be caused by adsorption on the surfaces of the objects 50 rather than by condensation of IPA.

In addition, it is found that formation of a mixture layer of the organic solvent or IPA and pure water visibly occurs on the surface of the pure water about ten seconds after the IPA mist enters the pure water tank 20. Therefore, when discharge of the pure water from the pure water tank 20 is completed within ten seconds after initiation of introduction of the IPA mist into the pure water tank 20, the mixture layer would not be formed on the surface of the pure water.

In the illustrated embodiment, wafers are used as the washed objects 50 by way of example. It is a matter of course that the illustrated embodiment may be likewise effectively applied to drying of a flat material such as liquid crystal display glass, a hard disc substrate, a small-sized material such as a lens, or the like. As described above, the pure water feed and discharge valve 21 may be constituted by either a three-way valve or a four-way valve. Use of the four-way valve permits chemicals as well as pure water to be fed for any desired chemical treatment.

As can be seen form the foregoing, the present invention is so constructed that mist of the organic solvent is generated by means of an ultrasonic wave in the organic solvent mist generating tank and washed objects are immersed in pure water in the pure water tank, the pure water tank and organic solvent mist generating tank are then operated to communicate with each other to discharge pure water and place the objects in an atmosphere of the organic solvent mist, and then nitrogen gas is fed to the pure water tank to purge the organic solvent mist with the nitrogen gas. Such construction eliminates a necessity of heating and cooling the organic solvent, to thereby promote energy saving. Also, it facilitates the drying operation because it is not required that an operator is careful with fire during the drying operation, to thereby ensure an improvement in productivity. Also, the drying operation is carried out in a closed environment, to thereby reduce consumption of the organic solvent and prevent contamination of the objects. In addition, the moisture or water is rapidly condensed in the organic solvent atmosphere at an increased concentration, resulting in excellent drying characteristics being exhibited. Moreover, the organic solvent mist is replaced with the inert or nitrogen gas atmosphere, to thereby effectively exclude oxygen, resulting in formation of any water mark being prevented.

What is claimed is:

1. A drying method for washed objects, comprising the steps of:
   rinsing the objects which are immersed in water in a water tank;
   generating mist of an organic solvent at a temperature of from about 20° C. to about 50° C. in an organic solvent mist generating tank by exciting the organic solvent by means of an ultrasonic wave;
   supplying the organic solvent mist to said water tank from said organic solvent mist generating tank while discharging the water from said water tank at a predetermined rate to thereby place the objects in an atmosphere of the organic solvent mist; and
   feeding nitrogen gas to said water tank to purge the organic solvent mist with the nitrogen gas.

2. A drying method as defined in claim 1, further comprising the step of maintaining the temperature of the organic solvent at a temperature of from about 20° C. to about 50° C.

3. A drying method as defined in claim 2, wherein the organic solvent is excited by an ultrasonic wave having a frequency greater than about 0.5 Megahertz and the organic solvent mist is adsorbed on surfaces of the objects.

4. A drying method as defined in claim 3, wherein the organic solvent is excited by an ultrasonic wave having a frequency in the range of 0.5 MHz to 10 MHz, and droplets of the organic solvent mist have a diameter not greater than 100 $\mu$m.

5. A drying method as defined in claim 4, wherein the predetermined rate at which the water is discharged from said water tank is selected so that droplets of the water and organic solvent or a liquid film of the water and organic solvent having a thickness of 10 nm to 1 $\mu$m is formed on the surfaces of the objects without forming a mixed layer of the water and the organic solvent on a surface of the water.

6. A drying method as defined in claim 3, wherein the predetermined rate at which the water is discharged from said water tank is selected so that droplets of the water and organic solvent or a liquid film of the water and organic solvent having a thickness of 10 nm to 1 $\mu$m is formed on the surfaces of the objects without forming a mixed layer of the water and the organic solvent on a surface of the water.

7. A drying method as defined in claim 1, wherein the organic solvent is excited by an ultrasonic wave having a frequency greater than about 0.5 Megahertz and the organic solvent mist is adsorbed on surfaces of the objects.

8. A drying method as defined in claim 7, wherein the organic solvent is excited by an ultrasonic wave having a frequency in the range of 0.5 MHz to 10 MHz, and droplets of the organic solvent mist have a diameter not greater than 100 $\mu$m.

9. A drying method as defined in claim 8, wherein the predetermined rate at which the water is discharged from said water tank is selected so that droplets of the water and organic solvent or a liquid film of the water and organic solvent having a thickness of 10 nm to 1 $\mu$m is formed on the surfaces of the objects without forming a mixed layer of the water and the organic solvent on a surface of the water.

10. A drying method as defined in claim 7, wherein the predetermined rate at which the water is discharged from said water tank is selected so that droplets of the water and organic solvent or a liquid film of the water and organic solvent having a thickness of 10 nm to 1 $\mu$m is formed on the surfaces of the objects without forming a mixed layer of the water and the organic solvent on a surface of the water.

11. A drying apparatus for washed objects, comprising:
   a water tank constructed so as to permit water to be introduced thereinto and discharged therefrom, to thereby rinse the objects which are immersed in the water;
   an organic solvent mist generating tank arranged so as to selectively communicate at an upper portion thereof with said water tank and constructed so as to permit an organic solvent charged therein to be excited by means of an ultrasonic wave, to thereby generate mist of the organic solvent at a temperature of from about 20° C. to about 50° C. in said organic solvent mist generating tank;
   an organic solvent mist supplying means for supplying the organic solvent mist to said water tank from said organic solvent mist generating tank;
   a water discharge means for discharging said water from said water tank at a predetermined rate while said water tank and organic solvent mist generating tank are operated to communicate with each other to thereby place the objects in an atmosphere of the organic solvent mist; and
   a nitrogen gas feeding means for feeding nitrogen gas to said water tank to purge the organic solvent mist with the nitrogen gas.

12. A drying apparatus as defined in claim 11, wherein said organic solvent mist generating tank has a double-tank structure including an inner tank member and an outer tank member;
   said outer tank member being mounted on an outer surface of a bottom thereof with a vibration plate having an ultrasonic transducer attached thereto;
   said inner tank member having a bottom formed with a thickness which permits ultrasonic energy to penetrate therethrough;
   said inner tank member and outer tank member being arranged so as to permit circulating water for temperature adjusting to flow within a space defined between said inner tank member and outer tank member;
   said inner tank member being charged therein with the organic solvent, which is circulated through a piping arranged in the circulating water.

13. A drying apparatus as defined in claim 12, wherein the apparatus is adapted so that an organic solvent is excited by an ultrasonic wave having a frequency greater than about 0.5 Megahertz and the organic solvent mist is adsorbed on surfaces of the objects.

14. A drying apparatus as defined in claim 13, wherein the apparatus is adapted so that an organic solvent is excited by an ultrasonic wave having a frequency in the range of 0.5 MHz to 10 MHz, the temperature of the mist of said organic solvent is selected to be about 20° C. to about 50° C. and droplets of the mist of said organic solvent are produced that have a diameter not greater than 100 µm.

15. A drying apparatus as defined in claim 11, wherein said water tank is so constructed that an upper portion thereof is selectively completely closed.

16. A drying apparatus as defined in claim 11, wherein the apparatus is adapted so that an organic solvent is excited by an ultrasonic wave having a frequency greater thou about 0.5 Megahertz and the organic solvent mist is adsorbed on surfaces of the objects.

17. A drying apparatus as defined in claim 16, wherein the apparatus is adapted so that an organic solvent is excited by an ultrasonic wave having a frequency greater than about 0.5 Megahertz, the temperature of the mist of said organic solvent is selected to be about 20° C. to about 50° C. and droplets of the mist of said organic solvent have a diameter not greater than about 100 µm.

18. A drying apparatus as defined in claim 17, wherein the predetermined rate at which said water is discharged by said water discharge means is selected so that without forming a mixed layer of the water and the organic solvent on a surface of the water, droplets of the water and organic solvent or a liquid film of the water and organic solvent having a thickness in the range of 10 nm to 1 µm is formed on the surfaces of the objects.

19. A drying apparatus as defined in claim 16, wherein the predetermined rate at which said water is discharged by said water discharge means is selected so that without forming a mixed layer of the water and the organic solvent on a surface of the water, droplets of the water and organic solvent or a liquid film of the water and organic solvent having a thickness of 10 nm to 1 µm is formed on the surfaces of the objects.

20. A drying apparatus as defined in claim 11, wherein the predetermined rate at which said water is discharged by said water discharge means is selected so that without forming a mixed layer of the water and the organic solvent on a surface of the water, droplets of the water and organic solvent or a liquid film of the water and organic solvent having a thickness of 10 nm to 1 µm is formed on the surfaces of the objects.

* * * * *